(12) United States Patent
Na et al.

(10) Patent No.: US 12,544,803 B2
(45) Date of Patent: Feb. 10, 2026

(54) SUBSTRATE PROCESSING APPARATUS

(71) Applicant: SEMES CO., LTD., Cheonan-si (KR)

(72) Inventors: Seungeun Na, Bucheon-si (KR); Kyungmin Kim, Cheonan-si (KR); Sinae Song, Hwaseong-si (KR); Hojin Jeong, Cheonan-si (KR); Jungeun Park, Seongnam-si (KR)

(73) Assignee: SEMES CO., LTD., Cheonan-si (KR)

( * ) Notice: Subject to any disclaimer, the term of this patent is extended or adjusted under 35 U.S.C. 154(b) by 261 days.

(21) Appl. No.: 18/228,297

(22) Filed: Jul. 31, 2023

(65) Prior Publication Data

US 2024/0116085 A1 Apr. 11, 2024

(30) Foreign Application Priority Data

Oct. 6, 2022 (KR) .................. 10-2022-0128080

(51) Int. Cl.
*B08B 3/02* (2006.01)
*B08B 3/08* (2006.01)
*H01L 21/67* (2006.01)

(52) U.S. Cl.
CPC .............. *B08B 3/022* (2013.01); *B08B 3/08* (2013.01); *H01L 21/67051* (2013.01)

(58) Field of Classification Search
CPC ...... B08B 3/022; B08B 3/08; H01L 21/67051
USPC ........................................ 134/95.3
See application file for complete search history.

(56) References Cited

U.S. PATENT DOCUMENTS

| 11,776,824 B2 | 10/2023 | Amano et al. |
| 2021/0020463 A1* | 1/2021 | Amano ............ H01L 21/30604 |
| 2022/0288650 A1 | 9/2022 | Kodera et al. |

FOREIGN PATENT DOCUMENTS

| KR | 1020080114180 A | 12/2008 |
| KR | 102174062 B1 | 11/2020 |
| KR | 10-2021-0009276 A | 1/2021 |
| KR | 1020220047335 A | 4/2022 |

OTHER PUBLICATIONS

Office Action issued Nov. 14, 2023 by the Korean Intellectual Property Office for corresponding KR Patent Application No. 10-2022-0128080.

* cited by examiner

*Primary Examiner* — Tinsae B Ayalew
(74) *Attorney, Agent, or Firm* — Muir Patent Law, PLLC

(57) ABSTRACT

The technical scope of the present disclosure provides a substrate processing apparatus including a first supply unit and a second supply unit each configured to spray a fluid onto a substrate seated on a substrate support unit, wherein the first supply unit includes a first supporter that is connected to a first support shaft configured to rotate so that the first supporter rotates integrally with the first support shaft; a connection member connected to the first supporter and bent by a first angle in a direction parallel to an upper surface of the substrate; and a first nozzle connected to the connecting member and bent at a predetermined angle toward the substrate, and the first supporter is configured to rotate by a second angle in a direction parallel to the upper surface of the substrate.

18 Claims, 12 Drawing Sheets

SUBSTRATE PROCESSING APPARATUS

CROSS-REFERENCE TO RELATED APPLICATION

This application is based on and claims priority under 35 U.S.C. § 119 to Korean Patent Application No. 10-2022-0128080, filed on Oct. 6, 2022, in the Korean Intellectual Property Office, the disclosure of which is incorporated by reference herein in its entirety.

BACKGROUND

1. Field

The present disclosure relates to a substrate processing apparatus, and more particularly, to a substrate cleaning apparatus.

2. Description of the Related Art

Contaminants, such as particles, organic contaminants, and metal contaminants remaining on a surface of a substrate greatly affect the characteristics and production yield of semiconductor devices. For this reason, a cleaning process for removing various contaminants attached to a surface of a substrate is very important in a semiconductor manufacturing process, and a process of cleaning a substrate is performed before and after each unit process for manufacturing a semiconductor. In general, the cleaning of a substrate includes a chemical treatment process for removing metal foreign substances, organic substances, or particles remaining on the substrate by using a chemical, a rinse process for removing chemicals remaining on the substrate by using pure water, and a drying process for drying the substrate by using an organic solvent, a supercritical fluid, or a nitrogen gas, etc.

SUMMARY

Provided is an apparatus capable of preventing particle contamination of a substrate.

Additional aspects will be set forth in part in the description which follows and, in part, will be apparent from the description, or may be learned by practice of the presented embodiments of the disclosure.

According to an aspect of an embodiment of the present disclosure, a substrate processing apparatus includes a first supply unit and a second supply unit each configured to spray a fluid onto a substrate seated on a substrate support unit, wherein the first supply unit includes a first supporter that is connected to a first support shaft configured to rotate so that the first supporter rotates integrally with the first support shaft, a connection member connected to the first supporter and bent by a first angle in a direction parallel to an upper surface of the substrate, and a first nozzle connected to the connecting member and bent at a predetermined angle toward the substrate, and the first supporter is configured to rotate by a second angle in a direction parallel to the upper surface of the substrate.

According to an embodiment, the second supply unit may include a second supporter that is connected to a second support shaft configured to rotate so that the second supporter integrally with the second support shaft and a second nozzle connected to the second supporter and bent at a predetermined angle toward the substrate.

According to an embodiment, the second nozzle may be configured to supply isopropyl alcohol (IPA), xylene, or a mixture of IPA and hydrofluoroether (HFE) onto the substrate.

According to an embodiment, the second supporter may be configured to rotate by a third angle in a direction parallel to the upper surface of the substrate, wherein the second angle may be greater than the first angle.

According to an embodiment, the second angle may be greater than 0 degrees and less than 90 degrees.

According to an embodiment, the first angle may be greater than 0 degrees and less than 90 degrees.

According to an embodiment, the substrate support unit may be configured to rotate in one direction, and the first nozzle may be disposed to spray a fluid in a same direction as the rotation direction of the substrate support unit.

According to an embodiment, the fluid may include deionized water (DIW).

According to an embodiment, the first nozzle may be disposed above a target region of the substrate, and the target region may have a circular shape having a second radius on the upper surface of the substrate having a disc shape with a first radius.

According to an embodiment, the first radius may be in a range of about 100 mm to about 500 mm, and the second radius may be in a range of about 50 mm to about 300 mm, wherein the second radius may be less than the first radius.

According to an aspect of a embodiment of the present disclosure, a substrate processing apparatus includes a first supply unit and a second supply unit each configured to spray a fluid onto a substrate seated on a substrate support unit, wherein the first supply unit includes a first supporter that is connected to a first support shaft configured to rotate so that the first supporter rotates integrally with the first support shaft, a first connection member connected to the first supporter and bent by a first angle in a direction parallel to an upper surface of the substrate, a second connecting member bent by a second angle in a direction parallel to the upper surface of the substrate, a second supporter disposed between the first connection member and the second connection member to connect the first connection member to the second connection member, and a first nozzle connected to the second connection member and bent at a predetermined angle toward the substrate, and the first supporter is configured to rotate by a third angle in a direction parallel to the upper surface of the substrate.

According to an embodiment, the second supply unit may include a third supporter that is connected to a second support shaft configured to rotate so that the third supporter rotates integrally with the second support shaft and a second nozzle connected to the third supporter and bent at a predetermined angle toward the substrate.

According to an embodiment, the third supporter is configured to rotate by a fourth angle in a direction parallel to the upper surface of the substrate, and the fourth angle is greater than the third angle.

According to an embodiment, the second nozzle may be configured to supply IPA, xylene, or a mixture of IPA and HFE onto the substrate.

According to an embodiment, the substrate support unit may be configured to rotate in one direction, wherein the first nozzle may be disposed to spray a fluid in a same direction as the rotation direction of the substrate support unit.

According to an embodiment, the fluid may include DIW.

According to an embodiment, the first nozzle may be disposed on a target region of the substrate, wherein the target region may have a circular shape having a second radius on the upper surface of the substrate having a disk shape having a first radius.

According to an embodiment, the first radius may be in a range of about 100 mm to about 500 mm, and the second radius may be in a range of about 50 mm to about 300 mm, wherein the second radius may be less than the first radius.

According to an aspect of an embodiment of the present disclosure, a substrate processing apparatus includes a first supply unit and a second supply unit each configured to spray a fluid onto a substrate seated on a substrate support unit, wherein the first supply unit includes a first supporter that is connected to a first support shaft configured to rotate so that the first supporter rotates integrally with the first support shaft, a connection member connected to the first supporter and bent by a first angle greater than 0 degrees and less than 90 degrees in a direction parallel to the upper surface of the substrate, a first nozzle connected to the connecting member and bent at a predetermined angle toward the substrate, and the substrate support unit is configured to rotate in one direction, the first nozzle is disposed to spray a fluid including DIW in a same direction as the rotation direction of the substrate support unit, the first nozzle is disposed above a target region of the substrate, and the target region has a circular shape with a second radius R2 that is in a range of about 50 mm to about 300 mm and is less than a first radius on an upper surface of the substrate having a disc shape with the first radius in a range of about 100 mm to about 500 mm, and the first supporter is configured to rotate by a second angle greater than 0 degrees and less than 90 degrees in a direction parallel to the upper surface of the substrate.

According to an embodiment, the second supply unit may include a second supporter that is connected to a second support shaft configured to rotate so that the second supporter integrally with the second support shaft, and a second nozzle connected to the second supporter and bent at a predetermined angle toward the substrate, wherein the second supporter is configured to rotate by a third angle greater than the second angle in a direction parallel to the upper surface of the substrate, and the second nozzle is configured to supply IPA, xylene, or a mixture of IPA and HFE onto the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
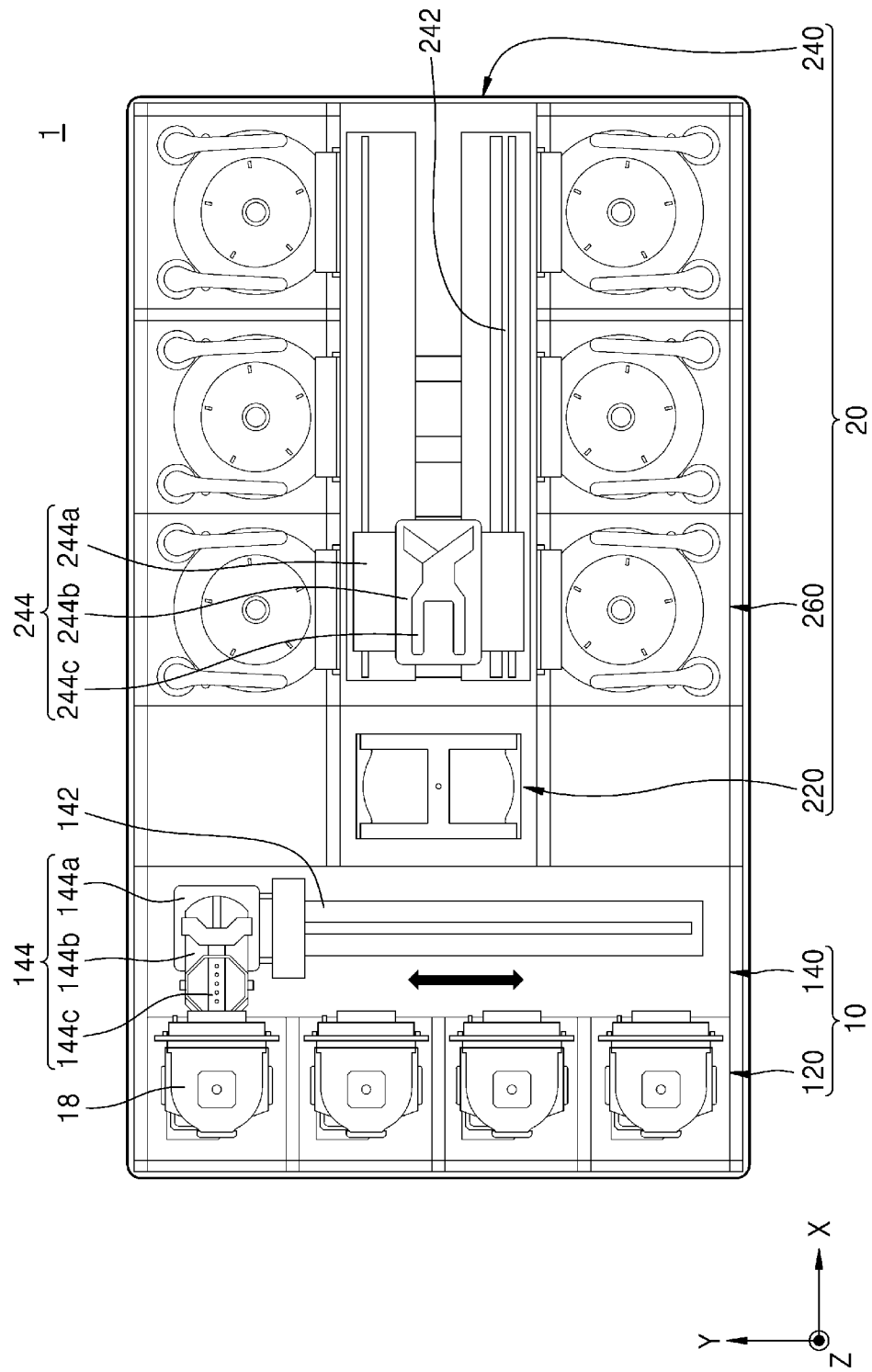
FIG. 1 is a schematic plan view showing a substrate processing apparatus according to the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. However, the present disclosure does not have to be configured as limited to the embodiments described below and may be embodied in various other forms. The following embodiments are provided not to fully complete the present disclosure, but rather to fully convey the scope of the present disclosure to those skilled in the art.

FIG. 1 is a schematic plan view showing a substrate processing apparatus 1 according to the present disclosure.

Referring to FIG. 1, the substrate processing apparatus 1 may include an index module 10 and a process processing module 20, and the index module 10 may include a load port 120 and a transfer frame 140. The load port 120, the transfer frame 140, and the process processing module 20 may be sequentially arranged in a line. Hereinafter, a direction in which the load port 120, the transfer frame 140, and the process processing module 20 are arranged is referred to as a first direction (x direction). In a top view of the substrate processing apparatus 1, a direction perpendicular to the first direction (x direction) is referred to as a second direction (y direction), and a direction perpendicular to a plane including the first direction (x direction) and the second direction (y direction) is referred to as a third direction (z direction)

A carrier 18 in which a substrate W is accommodated is seated in the load port 120. A plurality of load ports 120 may be provided, and they may be arranged in a line in the second direction (y direction). In FIG. 1, it is depicted that four load ports 120 are provided. However, the number of load ports 120 may increase or decrease depending on conditions, such as process efficiency and footprint of the process processing module 20. In the carrier 18, a plurality of slots (not shown) provided to support edges of the substrate W is formed. The plurality of slots may be provided in the second direction (y direction), and the substrates W may be positioned in the carrier 18 in a stacked state and spaced apart from each other in the second direction (y direction). A front opening unified pod (FOUP) may be used as the carrier 18.

According to an embodiment, the process processing module 20 may include a buffer unit 220, a transfer chamber 240, and a process chamber 260. The transfer chamber 240 may be disposed so that a longitudinal direction of which is parallel to the first direction (x direction). The process chambers 260 may be disposed on one side and the other side of the transfer chamber 240 in the second direction (y direction), respectively. The process chambers 260 located on one side of the transfer chamber 240 and the process chambers 260 located on the other side of the transfer chamber 240 may be provided symmetrically with respect to the transfer chamber 240. Some of the process chambers 260 may be disposed in a length direction of the transfer chamber 240. Also, some of the process chambers 260 may be stacked with each other. That is, on the one side of the transfer chamber 240, the process chambers 260 may be arranged in an array of A×B (where A and B are each a natural number of 1 or greater). Here, A is the number of process chambers 260 provided in a line in the first direction (x direction), and B is the number of process chambers 260 provided in a line in the second direction (y direction). When four or six process chambers 260 are provided on one side of the transfer chamber 240, the process chambers 260 may be arranged in a 2×2 or 3×2 arrangement. The number of process chambers 260 may increase or decrease. Unlike the above description, the process chamber 260 may be provided on only one side of the transfer chamber 240. Also, unlike the above description, the process chamber 260 may be provided on one side and both sides of the transfer chamber 240 in a single layer.

According to an embodiment, a buffer unit 220 may be disposed between the transfer frame 140 and the transfer chamber 240. The buffer unit 220 may provide a space where the substrate W stays before being transported between the transfer chamber 240 and the transfer frame 140. The buffer unit 220 includes slots (not shown) in which the substrate W is placed, and a plurality of slots (not shown) may be provided to be spaced apart from each other in the second direction (y direction). In the buffer unit 220, a surface facing the transfer frame 140 and a surface facing the transfer chamber 240 may be opened.

The transfer frame 140 may transport substrates W between the carrier 18 seated on the load port 120 and the buffer unit 220. The transfer frame 140 may be provided with an index rail 142 and an index robot 144. A length direction of the index rail 142 may be provided parallel to the second direction (y direction). The index robot 144 is installed on the index rail 142 and may be linearly moved along the index rail 142 in the second direction (y direction). The index robot 144 may include a base 144a, a main body 144b, and an index arm 144c. The base 144a may be installed to be movable along the index rail 142. The main body 144b may be coupled to the base 144a. The main body 144b may be provided to be movable in the second direction (y direction) on the base 144a. In addition, the main body 144b may be rotatably provided on the base 144a. The index arm 144c may be coupled to the main body 144b and movable forward and backward with respect to the main body 144b. A plurality of index arms 144c may be provided to be individually driven. The index arms 144c are stacked and spaced apart from each other in the second direction (y direction). Some of the index arms 144c may be used when transferring a substrate W from the process processing module 20 to the carrier 18, and some others may be used when transferring substrates W from the carrier 18 to the process processing module 20. Thus, in a process of carrying in and out the substrate W by the index robot 144, particles generated from the substrate W before a processing process may be prevented from attaching to the substrate W after the processing process.

According to an embodiment, the transfer chamber 240 transfers the substrate W between the buffer unit 220 and the process chamber 260 and between the process chambers 260. A guide rail 242 and a main robot 244 are provided in the transfer chamber 240. The guide rail 242 may be arranged so that a longitudinal direction of which is parallel to the first direction (x direction). The main robot 244 may be installed on the guide rail 242 and may move linearly in the first direction (x direction) on the guide rail 242. The main robot 244 may include a base 244a, a main body 244b, and a main arm 244c. The base 244a may be installed to be movable along the guide rail 242. The main body 244b may be coupled to the base 244a. The main body 244b may be provided to be movable in the second direction (y direction) on the base 244a. Also, the main body 244b may be rotatably provided on the base 244a. The main arm 244c is coupled to the main body 244b, and may be provided to move forward and backward with respect to the main body 244b. A plurality of main arms 244c may be provided to be individually driven. The main arms 244c may be stacked in a state of being spaced apart from each other in the second direction (y direction). The main arm 244c used to transfer substrates W from the buffer unit 220 to the process chamber 260 and the main arm 244c used to transfer substrates W from the process chamber 260 to the buffer unit 220 are may differ from each other.

According to an embodiment, a substrate processing apparatus 300 performing a cleaning process on the substrate W is provided in the process chamber 260. The substrate processing apparatus 300 provided in each process chamber 260 may have a different structure depending on the type of cleaning process to be performed. Optionally, the substrate processing apparatus 300 in each process chamber 260 may have the same structure. Optionally, the process chambers 260 may be divided into a plurality of groups, and the substrate processing apparatuses 300 provided in the process chambers 260 belonging to the same group may have the same structure and the substrate processing apparatuses 300 provided in the process chambers 260 belonging to different groups may have structures different from each other. For example, when the process chambers 260 are divided into two groups, a first group of the process chambers 260 may be provided on one side of the transfer chamber 240, and a second group of the process chambers 260 may be provided on the other side of the transfer chamber 240. Optionally, the first group of the process chambers 260 may be provided on a lower layer and the second group of the process chambers 260 may be provided on an upper layer of the transfer chamber 240 on each of the one side and the other side of the transfer chamber 240. The first group of the process chambers 260 and the second group of the process chambers 260 may be classified according to the type of chemical used or the type of cleaning method.

Figure 2:
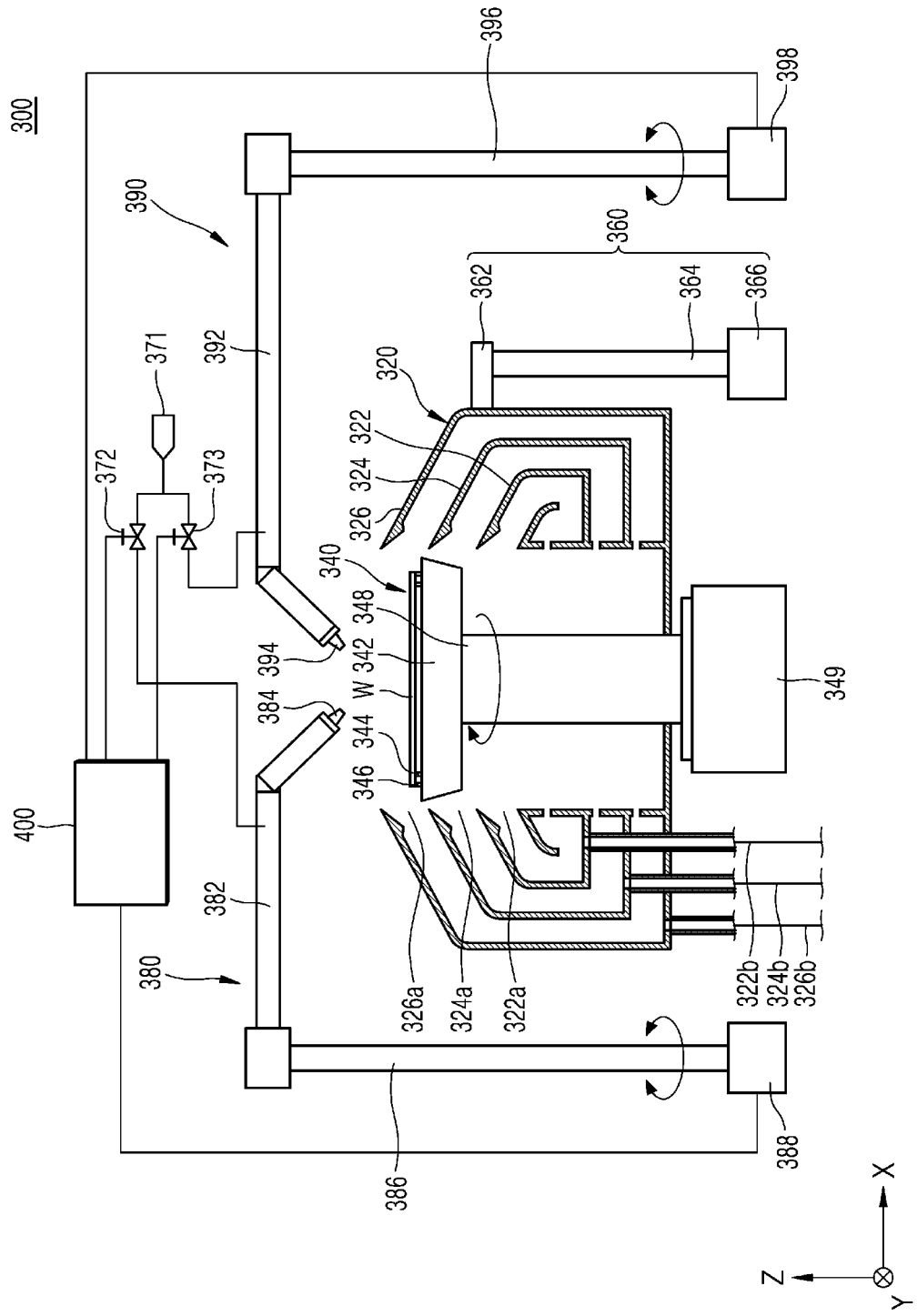
FIG. 2 is a schematic plan view illustrating a substrate processing apparatus according to an embodiment of the present disclosure.

An example of the substrate processing apparatus 300 for cleaning a substrate using a treatment liquid will be described below. FIG. 2 is a cross-sectional view showing an example of the substrate processing apparatus 300. Referring to FIG. 2, the substrate processing apparatus 300 may include a housing 320, a support unit 340, a lifting unit 360, a first supply unit 380, a second supply unit 390, and a controller 400.

According to an embodiment, the housing 320 provides a space in which a substrate processing process is performed, and an upper portion thereof may be opened. The housing 320 may have an inner recovery container 322, an intermediate recovery container 324, and an outer recovery container 326. Each of the inner, intermediate, and outer recovery containers 322, 324, and 326 may collect different treatment liquids among treatment liquids used in a process. The inner recovery container 322 may be provided in an annular ring shape surrounding the support unit 340, the intermediate recovery container 324 may be provided in an annular ring shape surrounding the inner recovery container 322, and the outer recovery container 326 may be provided in an annular ring shape surrounding the intermediate recovery container 324. An inner space 322a of the inner recovery container 322, a space 324a between the inner recovery container 322 and the intermediate recovery container 324, and a space 326a between the intermediate recovery container 324 and the outer recovery container 326 may respectively function as an inlet through which a treatment liquid flows into the inner recovery container 322, the intermediate recovery container 324, and the outer recovery container 326. Recovery lines 322b, 324b, and 326b extending vertically downward may be connected to lower surfaces of the inner, intermediate, and outer recovery containers 322, 324, and 326, respectively. Each of the recovery lines 322b, 324b, and 326b may discharge a treatment liquid introduced through each of the inner, intermediate, and outer recovery containers 322, 324, and 326. The discharged treatment liquid may be reused through an outer treatment liquid recovery system (not shown).

According to an embodiment, the support unit 340 may be provided within the housing 320. The support unit 340 supports the substrate W. The support unit 340 may serve as a substrate support unit 340 that rotates the supported substrate W. According to an embodiment, the substrate support unit 340 may be disposed inside the housing 320. The substrate support unit 340 may support the substrate W and rotate the substrate W during a process. The substrate support unit 340 may include a main body 342, support pins 344, chuck pins 346, and support shafts 348. The main body 342 may have an upper surface provided in a substantially circular shape in a top view thereof. The support shaft 348 that is rotatable by a motor 349 may be fixedly coupled to a bottom surface of the main body 342. A plurality of support pins 344 may be provided in the substrate support unit 340. The support pins 344 are spaced apart from each other at predetermined intervals on an edge of the upper surface of the main body 342 and may protrude upward from the main body 342. The support pins 344 may be arranged to have an annular ring shape as a whole by a combination with each other. The support pin 344 may support a rear edge of the substrate W so that the substrate W is separated from the upper surface of the main body 342 by a predetermined distance. A plurality of chuck pins 346 may be provided in the substrate support unit 340. The chuck pins 346 may be disposed farther than the support pin 344 from the center of the main body 342. The chuck pins 346 may be provided to protrude upward from the main body 342. The chuck pins 346 may support a side of the substrate W to prevent the substrate W from being laterally separated from an original position when the substrate support unit 340 is rotated. The chuck pins 346 may be provided to be linearly movable between a standby position and a support position in a radial direction of the main body 342. The standby position is a position farther from the center of the main body 342 compared to the support position. When the substrate W is loaded or unloaded from the substrate support unit 340, the chuck pins 346 are positioned at the standby position, and when a process is performed on the substrate W, the chuck pins 346 are positioned at the support position. In the support position, the chuck pins 346 may contact a side of the substrate W.

According to an embodiment, the lifting unit 360 may linearly move the housing 320 in a vertical direction. As the housing 320 moves up and down, a relative height of the housing 320 to the substrate support unit 340 may be changed. The lifting unit 360 may include a bracket 362, a moving shaft 364, and a driver 366. The bracket 362 may be fixedly installed on an outer wall of the housing 320, and the moving shaft 364 that moves in a vertical direction by the driver 366 may be fixedly coupled to the bracket 362. When the substrate W is placed on or lifted from the substrate support unit 340, the housing 320 may be lowered so that the substrate support unit 340 protrudes upward from the housing 320. In addition, when the process is in progress, a height of the housing 320 may be adjusted so that a treatment liquid may flow into a predetermined recovery container according to the type of treatment liquid supplied to the substrate W. For example, while the substrate W is being treated with a first treatment liquid, the substrate W may be positioned at a height corresponding to an inner space 322a of the inner recovery container 322. In addition, while the substrate W is processed with a second treatment liquid and a third treatment liquid, the substrate W may be positioned at a height corresponding to the space 324a between the inner recovery container 322 and the intermediate recovery container 324, and at a height corresponding to the space 326a between the intermediate recovery container 324 and the outer recovery container 326. Unlike the above description, the lifting unit 360 may move the substrate support unit 340 up and down instead of moving the housing 320.

According to an embodiment, the first supply unit 380 may include a first nozzle 384 for supplying a fluid onto the substrate W placed on the substrate support unit 340. For example, the first supply unit 380 may include a first supporter 382, the first nozzle 384, a first support shaft 386, and a first driver 388. The second supply unit 390 may include a second nozzle 394, a second supporter 392, a second support shaft 396, and a second driver 398 for supplying a fluid onto the substrate W. A storage container 371 for storing treatment liquid may be connected to the first nozzle 384 and the second nozzle 394 through a supply line. A plurality of valves 372 and 373 may be installed in the supply line. The configuration and structure of the second supply unit 390 may be similar to that of the first supply unit 380.

According to an embodiment, the controller 400 may determine whether the first nozzle 384 and the second nozzle 394 discharge a liquid, and control the valves 372 and 373 and the drivers 388 and 398 connected to the first nozzle 384 and the second nozzle 394 so that the first nozzle 384 and the second nozzle 394 adjust a supply point of a liquid on the substrate W, respectively. A method of treating a substrate W by controlling the first nozzle 384 and the second nozzle 394 by the controller 400 to supply a treatment liquid on to the substrate W supported by the substrate support unit 340 will be described later.

Figure 3A:
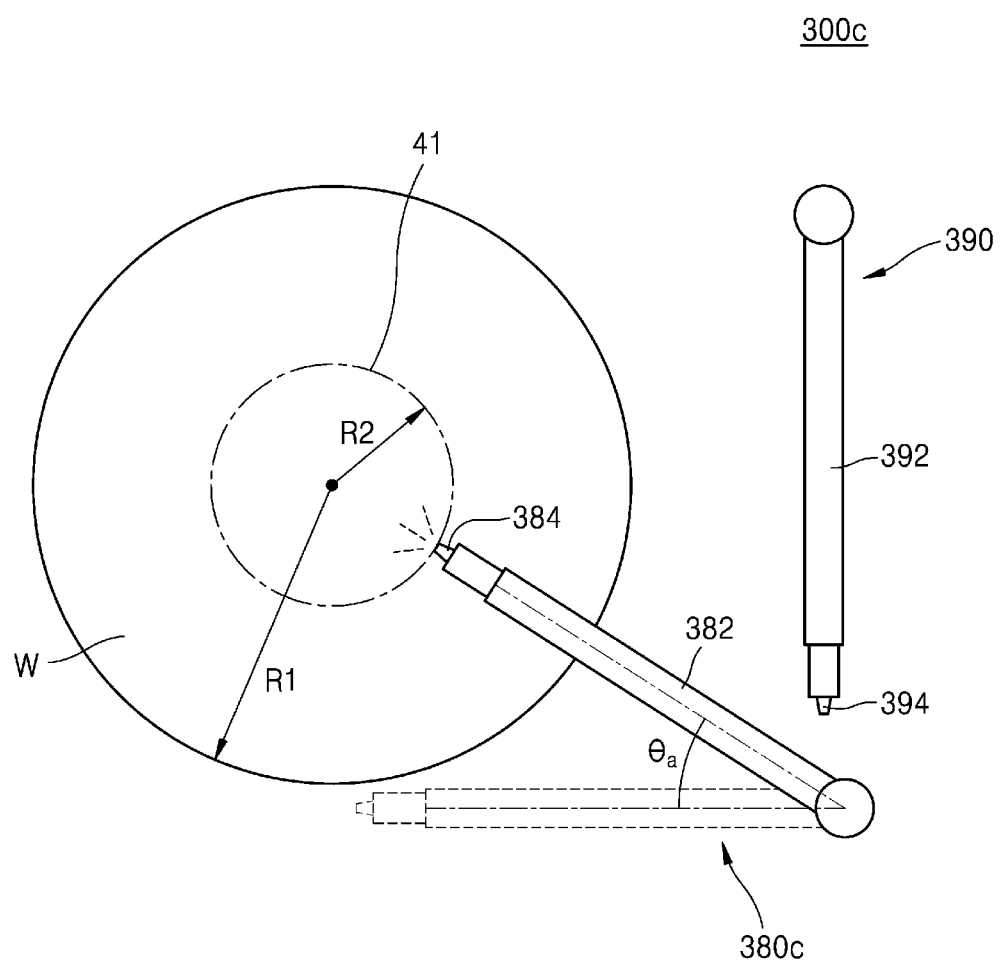
FIGS. 3A to 3C are plan views illustrating an operation process of a general substrate processing apparatus.
Figure 3B:
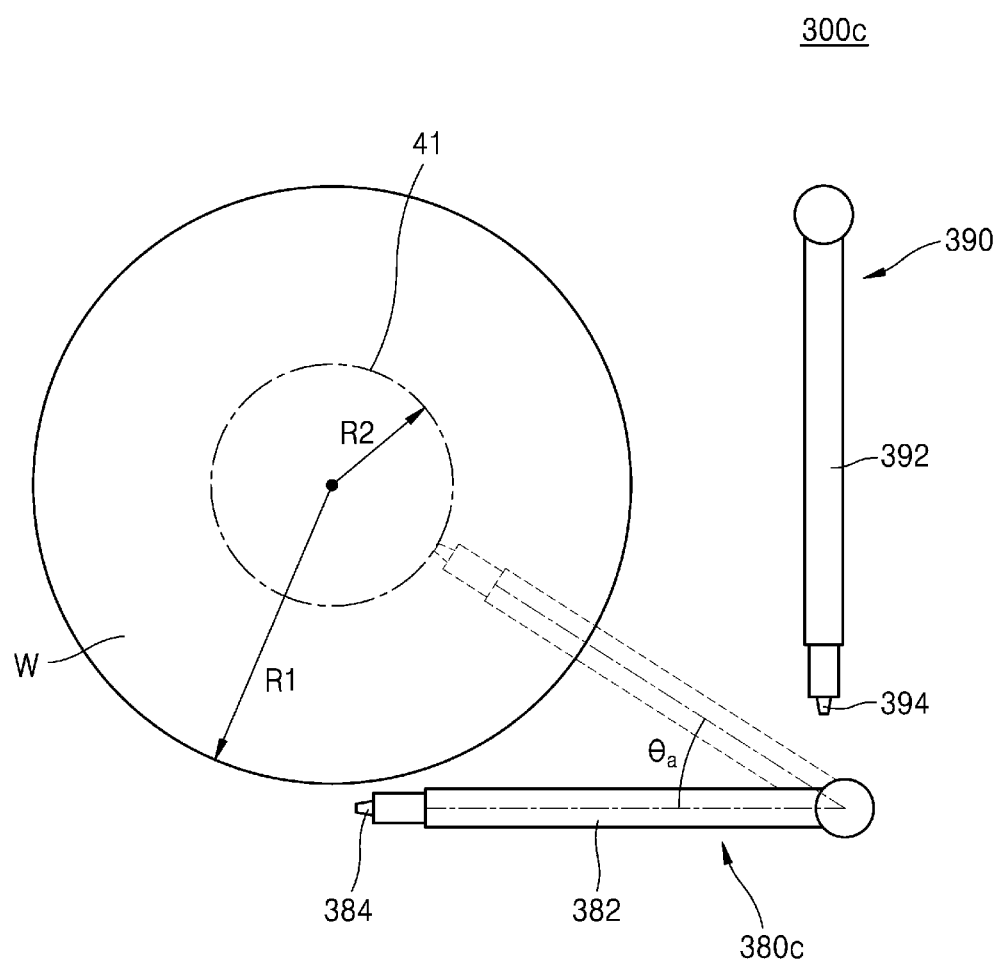
Figure 3C:
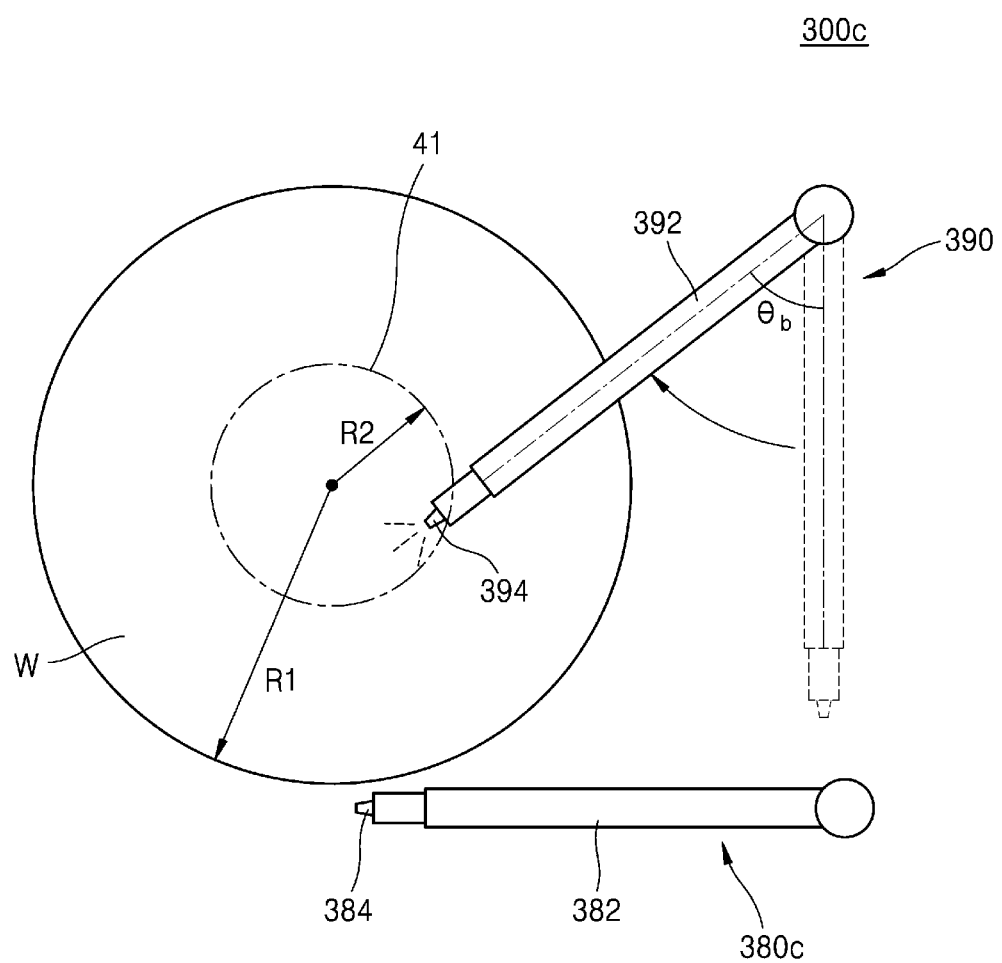

FIGS. 3A to 3C are plan views illustrating an operation process of a general substrate processing apparatus 300c.

Referring to FIG. 3A, a first supply unit 380c may be configured to spray a fluid onto the substrate W seated on the substrate support unit 340. The first supply unit 380c may include the first nozzle 384 disposed above an upper surface of the substrate W and supplying a fluid onto the substrate W, and the first supporter 382 connected to a support shaft and integrally rotating with the first support shaft.

According to an embodiment, the substrate W may have a shape of a disk having a second radius R1, and may have a target region 41 having a first radius R2 on an upper surface thereof. Primarily, the first supply unit 380c may rotate to supply a fluid to the target region 41 on the substrate W. Specifically, the first supply unit 380c may rotate by a first angle $\theta_a$ based on the first support shaft 386 so that the first nozzle 384 is disposed above the target region 41 of the substrate W. Thereafter, the first nozzle 384 may supply a fluid including deionized water (DIW) to the target region 41 of the substrate W.

Referring to FIGS. 3B and 3C, after the first nozzle 384 supplies a fluid onto the target region 41 of the substrate W, the first supply unit 380c may return to its original position. After the first nozzle 384 supplies a fluid, the second supply unit 390 supplies a fluid onto the target region 41 of the substrate W. However, in a state in which the first nozzle 384 is disposed on the target region 41, when the second supply unit 390 rotates toward the substrate W by a second angle θb, the second supply unit 390 may collide with the first supply unit 380c. Accordingly, the first supply unit 380c may rotate by a first angle θa in a direction opposite to that rotated in FIG. 3A for the rotation of the second supply unit 390. However, in this case, while the second supply unit 390 supplies a fluid onto the substrate W, the first supply unit 380c may not supply a fluid including DIW onto the substrate W. At this time, there may be a problem that the efficiency of processing particles present on the substrate W is reduced.

Figure 4:
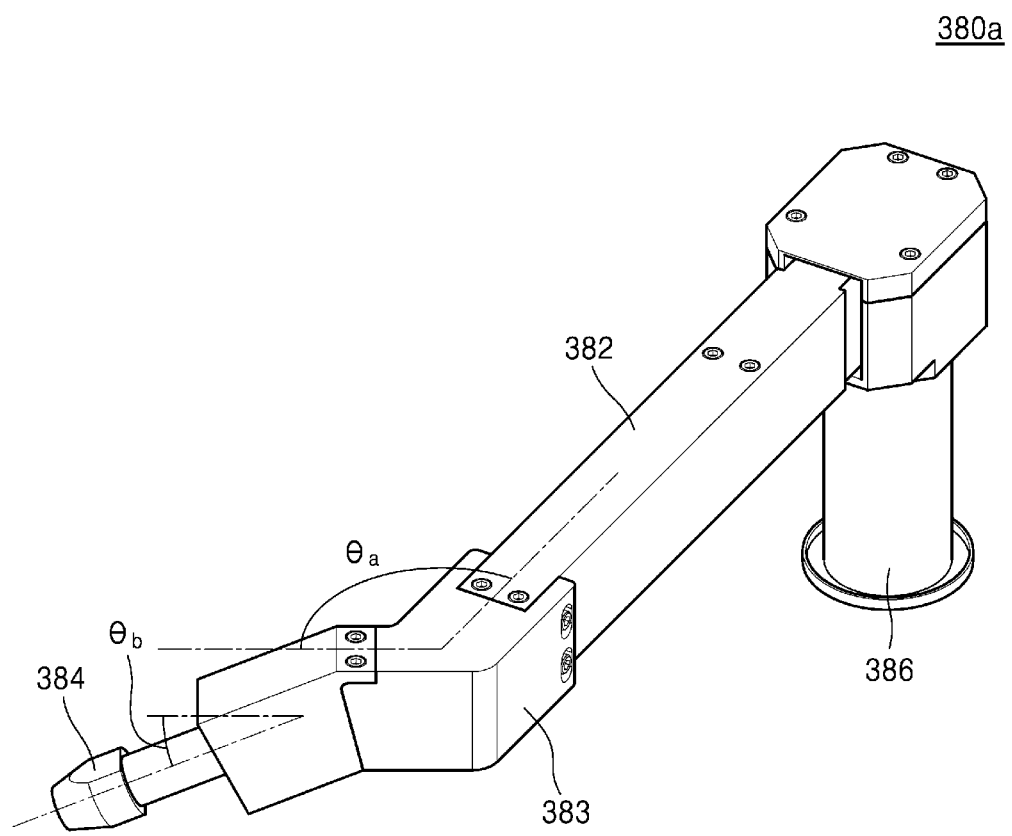
FIG. 4 is a perspective view showing a first supply unit according to an embodiment of the present disclosure.
Figure 5A:
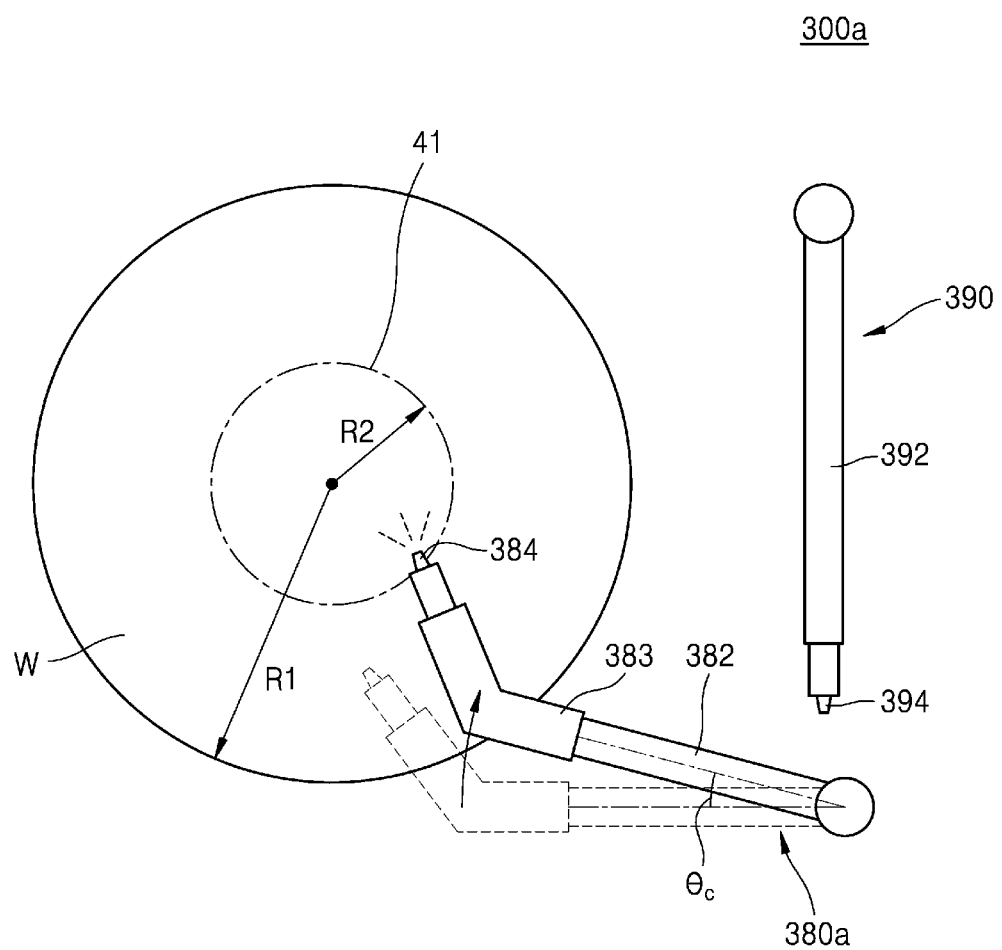
FIGS. 5A to 5B are plan views illustrating an operation of a substrate processing apparatus according to an embodiment of the present disclosure.
Figure 5B:
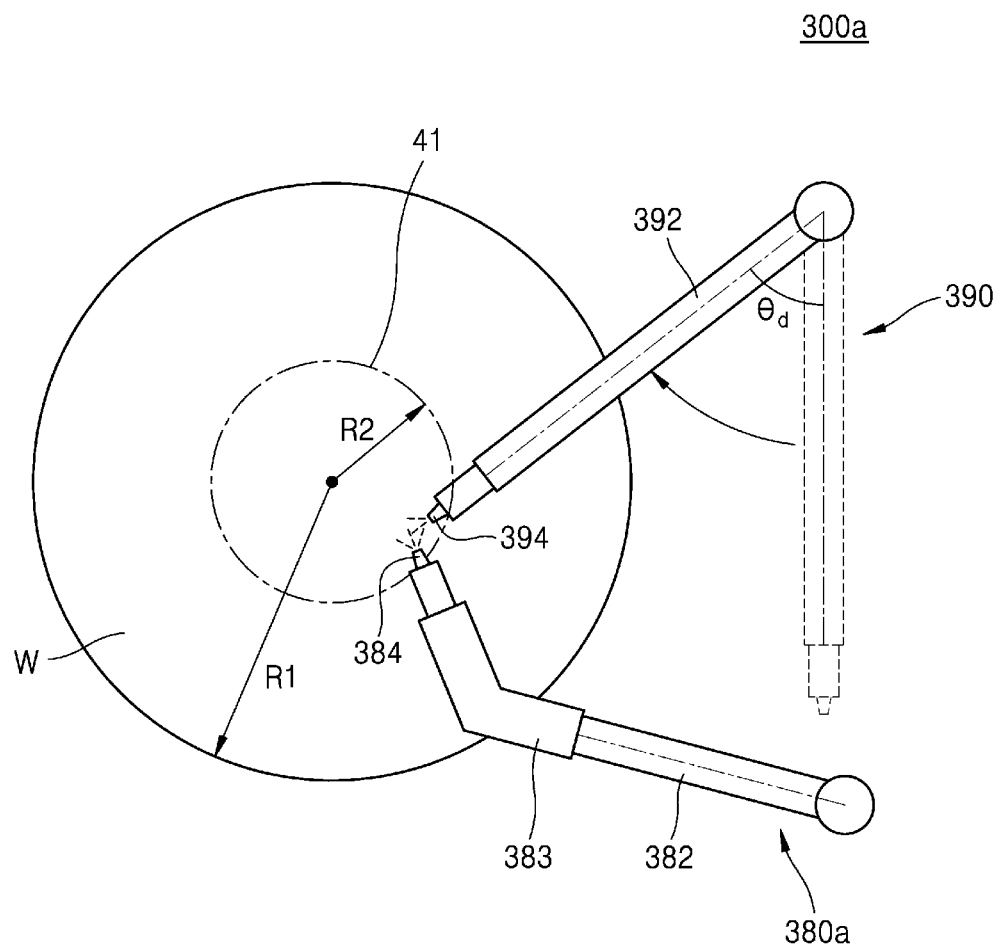

FIG. 4 is a perspective view showing a first supply unit 380a according to an embodiment of the present disclosure, and FIGS. 5A to 5B are plan views showing an operation process of a substrate processing apparatus 300a according to an embodiment of the present disclosure.

Referring to FIGS. 4, 5A, and 5B, the substrate processing apparatus 300a may include the first supply unit 380a and the second supply unit 390 configured to spray a fluid onto the substrate W seated on a substrate support unit. In this case, the first supply unit 380a may include the first supporter 382 that is connected to the first support shaft 386 configured to rotate and rotates integrally with the first support shaft 386. The first supporter 382 may extend in one direction parallel to the upper surface of the substrate W. The second supply unit 390 may include the second supporter 392 that is connected to the second support shaft 396 configured to rotate (hereinafter, refer to FIG. 2) and rotates integrally with the second support shaft 396 and a second nozzle 394 that is connected to the second supporter 392 and is bent at a predetermined angle toward the substrate.

In addition, the first supply unit 380a may include the connection member 383 that is connected to the first supporter 382 and is bent by a first angle $\theta_a$ in a direction parallel to the upper surface of the substrate W and the first nozzle 384 connected to the connection member 383. The first nozzle 384 may be connected to the connection member 383 and may be bent at a predetermined angle $\theta_b$ toward the substrate W. In this case, the first angle $\theta_a$ may be greater than 90 degrees and less than 180 degrees.

As shown in FIGS. 5A and 5B, the first supply unit 380a and the second supply unit 390 may be configured to spray a fluid onto the substrate W seated on a substrate support unit. Specifically, the first supply unit 380a and the second supply unit 390 may be configured to supply a fluid to the target region 41 on the substrate W. In this case, the fluid supplied by the first supply unit 380a may be DIW, and the fluid supplied by the second supply unit 390 may be isopropyl alcohol (IPA), xylene, or a mixture of IPA and hydrofluoroether (HFE). As shown in FIG. 2, the substrate support unit 340 may be configured to rotate in one direction, and the first nozzle 384 of the first supply unit 380a may spray a fluid to an upper surface of the substrate W. In this case, the first nozzle 384 may be disposed to spray a fluid in the same direction as a rotation direction of the substrate support unit 340. Because the first nozzle 384 sprays a fluid in the same direction as the rotation direction of the substrate support unit 340, the possibility of damaging the substrate W during a cleaning process may be reduced.

Primarily, the first supply unit 380a may rotate at a predetermined angle to supply a fluid to the target region 41 of the substrate W. Specifically, the first supporter 382 may rotate by a second angle $\theta_c$ in a direction parallel to the upper surface of the substrate W with respect to the first support shaft 386. While the first supporter 382 rotates by a first angle $\theta_a$, the first nozzle 384 may be disposed above the target region 41. In this case, the second angle $\theta_c$ may be greater than 0 degrees and less than 90 degrees in order for the first nozzle 384 to be disposed above the target region 41.

According to an embodiment, the first nozzle 384 may be disposed above the target region 41 of the substrate W, and the target region 41 may have a circular shape with a second radius R2 on the upper surface of the substrate W having a disc shape with a first radius R1. In this case, the first radius R1 may be in a range of about 100 mm to about 500 mm, and the second radius R2 may be in a range of about 50 mm to about 300 mm. The second radius R2 may be less than the first radius R1. Accordingly, the target region 41 may be a region included on the upper surface of the substrate W.

Afterwards, the second supply unit 390 may rotate by a third angle $\theta_d$ to supply a fluid to the target region 41 of the substrate W. At this time, the second supporter 392 may be configured to rotate by a third angle $\theta_d$ in a direction parallel to the upper surface of the substrate W. The third angle $\theta_d$ may be greater than the second angle $\theta_c$. Because the connecting member 383 of the first supply unit 380a is bent at the first angle $\theta_a$, even if the first supporter 382 rotates at a smaller angle, the first nozzle 384 may be positioned above the target region 41. Accordingly, when the second supply unit 390 rotates by the third angle $\theta_d$, the second supply unit 390 may not collide with the first supply unit 380. Unlike the first supply unit 380c shown in FIGS. 3A to 3C, the first supply unit 380a may not rotate to its original position. Therefore, while the first supply unit 380a continuously supplies a fluid onto the target region 41, the second supply unit 390 may also supply a fluid onto the target region 41. Because the first supply unit 380a continuously supplies a fluid to the target region 41, the generation of particles on the substrate W during a cleaning process may further be minimized.

Figure 6A:
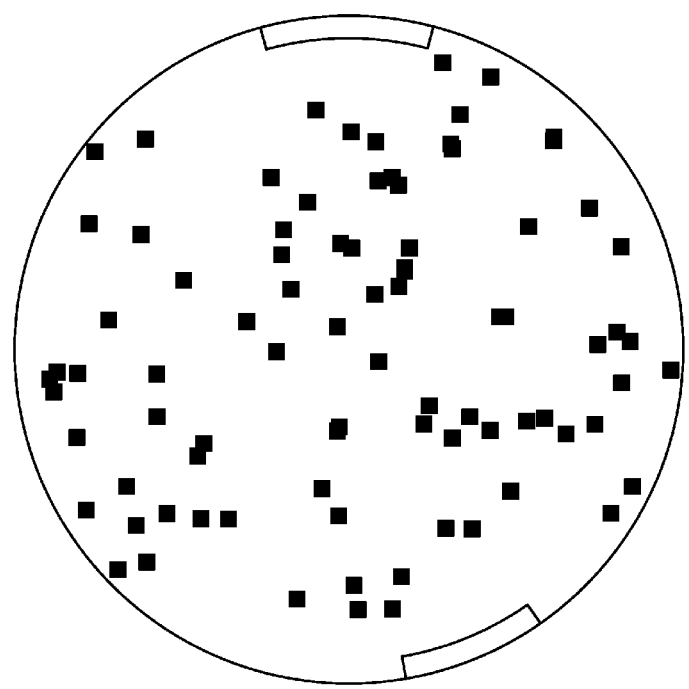
FIGS. 6A and 6B are diagrams illustrating effects of a substrate processing apparatus according to an embodiment of the present disclosure.
Figure 6B:
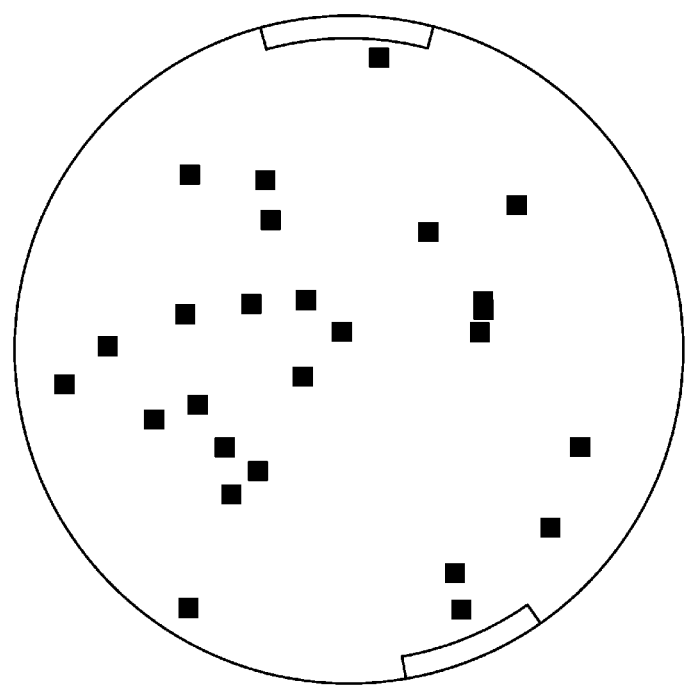

FIGS. 6A and 6B are diagrams illustrating effects of the substrate processing apparatus 300 according to an embodiment of the present disclosure. Specifically, FIG. 6A is a view showing particles on the substrate W after the substrate processing apparatus 300c shown in FIGS. 3A to 3C is operated, and FIG. 6B is a view showing particles on the substrate W after the substrate processing apparatus 300a shown in FIGS. 5A and 5B is operated.

Referring to FIGS. 3A to 3C and 6A, when the second supply unit 390 supplies a fluid onto the substrate W, the first supply unit 380c does not supply DIW onto the substrate W. Accordingly, particles that are not cleaned by DIW may present on the substrate W.

On the other hand, referring to FIGS. 5A, 5B, and 6B, when the second supply unit 390 supplies a fluid onto the substrate W, the first supply unit 380a may supply DIW onto the substrate W. Because the first supply unit 380a includes the connection member 383 bent at the first angle $\theta_a$, the possibility of collision between the first supply unit 380a and the second supply unit 390 may be reduced during rotation of the second supply unit 390. Accordingly, as shown in FIG. 6B, the generation of particles on the substrate W may be prevented due to continuous DIW supply from the first supply unit 380a.

Figure 7:
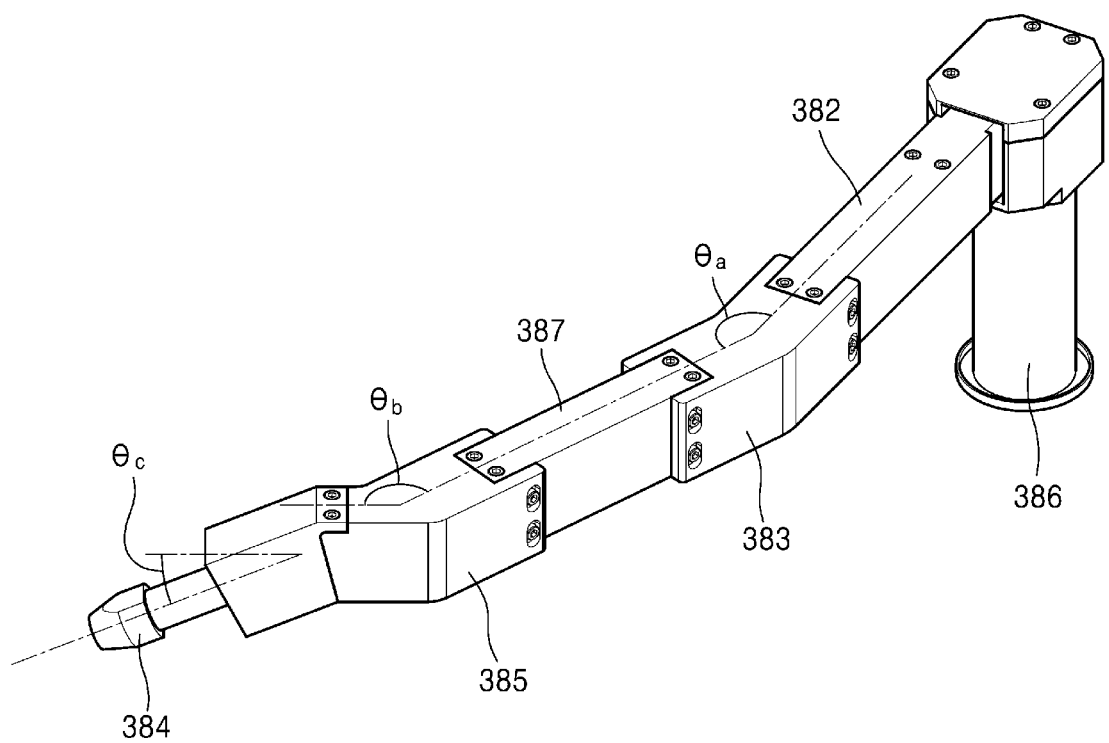
FIG. 7 is a perspective view showing a first supply unit according to another embodiment of the present disclosure.
Figure 8:
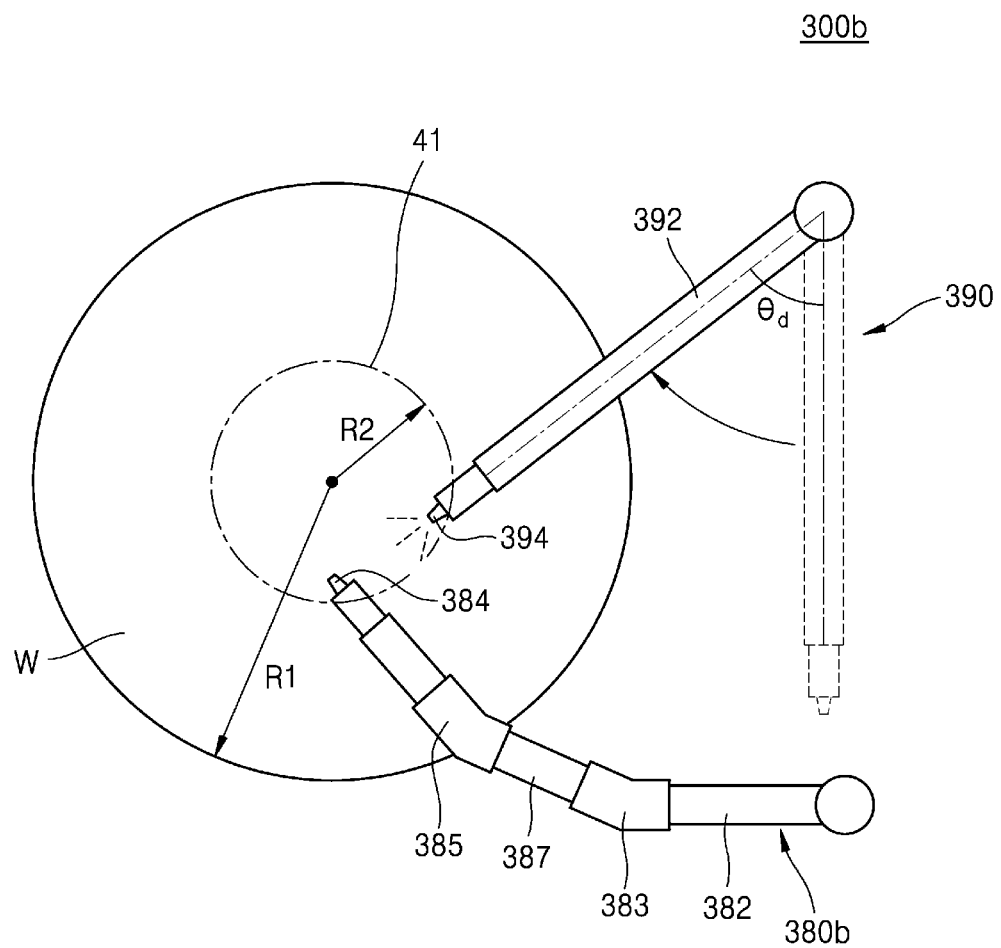
FIG. 8 is a plan view illustrating an operation process of a substrate processing apparatus according to another embodiment of the present disclosure.

FIG. 7 is a perspective view illustrating a first supply unit 380b according to another embodiment of the present disclosure, and FIG. 8 is a plan view illustrating an operation of a substrate processing apparatus 300b according to another embodiment of the present disclosure.

Specifically, when the substrate processing apparatus 300b according to another embodiment is compared to the substrate processing apparatus 300a shown in FIGS. 2, 5A, and 5B, except for the structure of the first supply unit 300b, the substrate processing apparatus 300b may be similar or identical to the substrate processing apparatus 300a. Therefore, descriptions with respect to configurations overlapping with the substrate processing apparatus 300a shown in FIG. 2 will be referred to FIG. 2 or omitted.

Referring to FIGS. 2, 7, and 8, the substrate processing apparatus 300b may include a first supply unit 380b and a second supply unit 390 that are configured to spray a fluid onto a substrate W seated on a substrate support unit 340. In this case, the first supply unit 380b may include a first supporter 382 that is connected to the first support shaft 386 configured to rotate. Accordingly, the first supporter 382 rotates integrally with the first support shaft 386. The first supporter 382 may extend in one direction parallel to an upper surface of the substrate W. The second supply unit 390 may include a second support shaft 392 that is connected to a second support shaft 396 configured to rotate (hereinafter, refer to FIG. 2) and rotates integrally with the second support shaft 396 and a second nozzle 394 connected to the second supporter 392 and bent at a predetermined angle toward the substrate.

In addition, the first supply unit 380b may include a first connection member 383 connected to the first supporter 382 and bent by a first angle θa in a direction parallel to an upper surface of the substrate W and a second connection member 385 bent by a second angle θb in a direction parallel to the upper surface of the substrate W. In addition, the first supply unit 380b may include a second supporter 387 disposed between the first connection member 383 and the second connection member 385 to connect the first connection member 383 and the second connection member 385. In this case, each of the first angle θa and the second angle θb may be greater than 90 degrees and less than 180 degrees.

According to an embodiment, the first supply unit 380b may include a first nozzle 384 connected to the second connection member 385 and bent toward the substrate W by a predetermined angle $\theta_c$. The first nozzle 384 may supply a first fluid onto the substrate W. The first fluid may be DIW.

According to an embodiment, the first nozzle 384 may be disposed on a target region 41 of the substrate W. The target region 41 may have a circular shape with a second radius R2 on the upper surface of the substrate W having a disc shape with a first radius R1. In this case, the first radius R1 may be in a range of 100 mm to 500 mm, and the second radius R2 may be in a range of 50 mm to 300 mm. The second radius R2 may be less than the first radius R1. Accordingly, the target region 41 may be a region included on the upper surface of the substrate W. The first supporter 382 may be rotated by a third angle so that the first nozzle 384 is disposed above the target region 41. In this case, the third angle may be similar to the third angle $\theta_c$ at which the first supply unit 380a rotates, as shown in FIG. 5A.

According to an embodiment, the second supply unit 390 may rotate by a fourth angle $\theta_d$ to supply a fluid to the target region 41 of the substrate W. At this time, the third supporter 392 may be configured to rotate by a fourth angle $\theta_d$ in a direction parallel to the upper surface of the substrate W. The fourth angle $\theta_d$ may be greater than the rotational angle of the first supply unit 380b. Because the first connecting member 383 and the second connecting member 385 of the first supply unit 380a are bent at the first angle $\theta_a$ and the second angle $\theta_b$, respectively, even if the first supporter 382 is rotated at a smaller angle than the first angle $\theta_a$ shown in FIG. 3a, the first nozzle 384 may be disposed above the target region 41. Therefore, when the second supply unit 390 rotates by the fourth angle $\theta_d$, the second supply unit 390 may not collide with the first supply unit 380b. Unlike the first supply unit 380c shown in FIGS. 3A to 3C, the first supply unit 380b may not rotate to its original position. Accordingly, while the first supply unit 380b continuously supplies a fluid onto the target region 41, the second supply unit 390 may also supply a fluid to the target region 41. Because the first supply unit 380b continuously supplies a fluid to the target region 41, generation of particles on the substrate W during a cleaning process may further be minimized.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising a first supply unit and a second supply unit each configured to spray a fluid onto a substrate seated on a substrate support unit,
   wherein the first supply unit includes:
   a first supporter that is connected to a first support shaft configured to rotate so that the first supporter rotates integrally with the first support shaft;
   a connection member connected to the first supporter and bent by a first angle long a plane parallel to an upper surface of the substrate when the substrate is seated on the substrate support unit; and
   a first nozzle connected to the connection member and bent at a predetermined angle toward the substrate,
   wherein the first supporter and the connection member form a first arm that is bent between the first support shaft the first nozzle,
   wherein the first supporter is configured to rotate by a second angle along the plane parallel to the upper surface of the substrate when the substrate is seated on the substrate unit,
   wherein the second supply unit includes:
   a second supporter that is connected to a second support shaft configured to rotate so that the second supporter rotates integrally the second support shaft; and
   a second nozzle connected to second supporter and bent a predetermined angle toward the substrate, and
   wherein the second supporter forms a second arm that together with the second nozzle is straight, from a top view, from the second support shaft to a discharge end of the second nozzle.

2. The substrate processing apparatus of claim 1, wherein the second nozzle is configured to supply isopropyl alcohol (IPA), xylene, or a mixture of IPA and hydrofluoroether (HFE) onto the substrate.

3. The substrate processing apparatus of claim 1, wherein the second supporter is configured to rotate by a third angle along the plane parallel to the upper surface of the substrate, wherein the second angle is greater than the first angle, and wherein the first supporter is rotated by the second angle, and the second supporter is rotated by the third angle, spray fluid sprayed from the first nozzle and spray fluid sprayed by the second nozzle are sprayed to the same target region of the substrate when the substrate is seated on the support unit.

4. The substrate processing apparatus of claim 1, wherein the first angle is greater than 0 degrees and less than 90 degrees.

5. The substrate processing apparatus of claim 1, wherein the second angle is greater than 0 degrees and less than 90 degrees.

6. The substrate processing apparatus of claim 1, wherein
the substrate support unit is configured to rotate in one direction, and
the first nozzle is disposed to spray a first fluid in the same direction as the rotation direction of the substrate support unit.

7. The substrate processing apparatus of claim 6, wherein the fluid is deionized water (DIW).

8. The substrate processing apparatus of claim 1, wherein
the first nozzle is configured to be disposed above a target region of the substrate when the substrate is seated on the support unit, and
the target region has a circular shape having a second radius on the upper surface of the substrate, which has a disc shape with a first radius.

9. The substrate processing apparatus of claim 8, wherein the first radius is in a range of about 100 mm to about 500 mm, and the second radius is in a range of about 50 mm to about 300 mm,
wherein the second radius is less than the first radius.

10. A substrate processing apparatus comprising a first supply unit and a second supply unit each configured to spray a fluid onto a substrate seated on a substrate support unit,
wherein the first supply unit includes:
a first supporter that is connected to a first support shaft configured to rotate so that the first supporter rotates integrally with the first support shaft;
a first connection member connected to the first supporter and bent by a first angle along a plane parallel to an upper surface of the substrate when the substrate is seated on the substrate support unit;
a second connection member bent by a second angle along the plane parallel to the upper surface of the substrate when the substrate is seated on the substrate support unit;
a second supporter disposed between the first connection member and the second connection member to connect the first connection member to the second connection member;
a first nozzle connected to the second connection member and bent at a predetermined angle toward the substrate, and
the first supporter is configured to rotate by a third angle along a plane parallel to the upper surface of the substrate when the substrate is seated on the substrate support unit,
wherein the first supporter, the first connection member, the second supporter, and the second connection member form a first arm that is bent between the first support shat and the first nozzle, and
wherein the second supply unit includes;
a third supporter that is connected to a second support shaft configured to rotate so that the third supporter rotates integrally with the second support shaft; and
a second nozzle connected to the third supporter and bent at a predetermined angle toward the substrate,
wherein the third supporter forms a second arm that together with the second nozzle is straight, from a top view, from the second support shaft to a discharge end of the second nozzle.

11. The substrate processing apparatus of claim 10, wherein the third supporter is configured to rotate by a fourth angle along a plane parallel to the upper surface of the substrate when the substrate is seated on the substrate support unit, and the fourth angle is greater than the third angle, and wherein when the first supporter is rotated by the third angle, and the third supporter is rotated by the fourth angle, spray fluid sprayed from the first nozzle and spray fluid sprayed by the second nozzle are sprayed to the same target region of the substrate.

12. The substrate processing apparatus of claim 10, wherein the second nozzle is configured to supply IPA, xylene, or a mixture of IPA and HFE onto the substrate.

13. The substrate processing apparatus of claim 10, wherein the substrate support unit is configured to rotate in one direction,
wherein the first nozzle is disposed to spray a first fluid in the same direction as the rotation direction of the substrate support unit.

14. The substrate processing apparatus of claim 13, wherein the first fluid includes DIW.

15. The substrate processing apparatus of claim 11, wherein the first nozzle is configured to be disposed on a target region of the substrate when seated on the support unit, wherein
the target region has a circular shape having a second radius on the upper surface of the substrate, which has a disk shape with a first radius.

16. The substrate processing apparatus of claim 15, wherein the first radius is in a range of about 100 mm to about 500 mm, and the second radius is in a range of about 50 mm to about 300 mm,
wherein the second radius is less than the first radius.

17. A substrate processing apparatus comprising a first supply unit and a second supply unit each configured to spray a fluid onto a substrate seated on a substrate support unit,
wherein the first supply unit includes:
a first supporter that is connected to a first support shaft configured to rotate so that the first supporter rotates integrally with the first support shaft;
a connection member connected to the first supporter and bent by a first angle greater than 90 degrees and less than 180 degrees along a plane parallel to the upper surface of the substrate when the substrate is seated on the substrate support unit; and
a first nozzle connected to the connection member and bent at a predetermined angle toward the substrate,
wherein the first supporter shaft and the first nozzle, member form a first arm that is bent between the first support shaft and the first nozzle,
wherein the substrate support unit is configured to rotate in one direction, and the first nozzle is disposed to spray deionized water in the same direction as the rotation direction of the substrate support unit,
wherein the first nozzle is configured to be disposed above a target region of the substrate, and the target region has a circular shape with a second radius R2 that is in a range of about 50 mm to about 300 mm and is less than a first radius on an upper surface of the substrate having a disc shape with the first radius in a range of about 100 mm to about 500 mm, wherein the first supporter is configured to rotate by a second angle greater than 0 degrees and less than 90 degrees in a direction parallel to the upper surface of the substrate, and wherein the second supply unit includes;

a second supporter that is connected to a second support shaft configured to rotate so that the second supporter rotates integrally with the second support shaft; and a second nozzle connected to the second supporter and bent at a predetermined angle toward the substrate, and wherein the second supporter forms a second arm from the second support shaft to the second nozzle, and the first and is bent a greater amount than the second arm.

18. The substrate processing apparatus of claim 17, wherein:

the second supporter is configured to rotate by a third angle greater than the second angle along the plane parallel to the upper surface of the substrate, wherein when the first supporter is rotated by the second angle, and the second supporter is rotated by the third angle, spray fluid sprayed from the first nozzle and spray fluid sprayed by the second nozzle are sprayed to the same target region of the substrate when seated on the support unit and the second nozzle is configured to supply IPA, xylene, or a mixture of IPA and HFE onto the substrate.

* * * * *